United States Patent
Chino et al.

(10) Patent No.: US 8,980,366 B2
(45) Date of Patent: Mar. 17, 2015

(54) CONDITIONING METHOD, COMPUTER READABLE STORAGE MEDIUM AND SUBSTRATE PROCESSING APPARATUS

(75) Inventors: Takashi Chino, Nirasaki (JP); Yojiro Aoki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 79 days.

(21) Appl. No.: 13/433,509

(22) Filed: Mar. 29, 2012

(65) Prior Publication Data

US 2012/0251704 A1 Oct. 4, 2012

(30) Foreign Application Priority Data

Mar. 31, 2011 (JP) .................. 2011-080074

(51) Int. Cl.
  *C23C 16/00* (2006.01)
  *C23C 16/52* (2006.01)
  *C23C 16/44* (2006.01)

(52) U.S. Cl.
  CPC ................ *C23C 16/00* (2013.01); *C23C 16/44* (2013.01); *C23C 16/4401* (2013.01); *C23C 16/52* (2013.01)
  USPC .......................................... 427/8; 427/248.1

(58) Field of Classification Search
  CPC ...... C23C 16/00; C23C 16/4401; C23C 16/52
  USPC ................................. 427/8, 248.1
  See application file for complete search history.

(56) References Cited

U.S. PATENT DOCUMENTS

| 5,943,230 A * | 8/1999 | Rinnen et al. .................. 700/18 |
| 2005/0015174 A1 | 1/2005 | Arai et al. | |

FOREIGN PATENT DOCUMENTS

| JP | 10-326731 | 12/1998 |
| JP | 2003-45766 | 2/2003 |
| JP | 2003-168637 | 6/2003 |
| JP | 2003-221671 | 8/2003 |
| KR | 10-2004-0053384 A | 6/2004 |
| KR | 10-1001309 B1 | 12/2010 |

OTHER PUBLICATIONS

Office Action issued Jul. 10, 2013 in Korean Patent Application No. 10-2012-0033414.

Office Action issued Oct. 14, 2014 in Japanese Patent Application No. 2011-080074.

\* cited by examiner

*Primary Examiner* — Kelly M Gambetta
(74) *Attorney, Agent, or Firm* — Oblon, McClelland, Maier & Neustadt, L.L.P.

(57) ABSTRACT

In a conditioning method conditions interiors of a plurality of process chambers of a substrate processing apparatus, conditioning of the interior of the first process chamber is performed if a first integrated value set in connection with the process of the substrate reaches a set value N1. The second process chamber is set in a standby state when the conditioning of the first process chamber starts and the series of processes is stopped. By determining whether a second integrated value set in connection with process of the substrate in the second process chamber is equal to or greater than a set value N2, count of a third integrated value in the second process chamber is started if the second integrated value is equal to or greater than the set value N2. A conditioning of the second process chamber is performed if the third integrated value exceeds a set value N3.

12 Claims, 8 Drawing Sheets

CONDITIONING METHOD, COMPUTER READABLE STORAGE MEDIUM AND SUBSTRATE PROCESSING APPARATUS

CROSS-REFERENCE TO RELATED APPLICATION

This application claims priority to Japanese Patent Application No. 2011-080074 filed on Mar. 31, 2011, the entire contents of which are incorporated herein by reference.

FIELD OF THE INVENTION

The present invention relates to a method of conditioning the interiors of a plurality of process chambers in which substrates are subjected to a predetermined process, and a computer readable storage medium and a substrate processing apparatus for use with the conditioning method.

BACKGROUND OF THE INVENTION

In a semiconductor device manufacturing process, predetermined processes such as film forming, etching and so on are performed on semiconductor wafers as substrates to be processed. In addition, in a flat panel display (FPD) manufacturing process, predetermined processes such as film forming, etching and so on are performed on glass substrates for FPD. These processes use a multi-chamber type substrate processing apparatus including a plurality of process chambers in which the predetermined processes are performed on the substrates. The use of this substrate processing apparatus allows the substrates to be subjected to a plurality of processes in a consistent atmosphere.

However, in the semiconductor device and FPD manufacturing processes, in some cases, different kinds of processes may be consecutively performed in the substrate processing apparatus. A series of processes is feasible by a combination of a plurality of process chambers having different conditions. For example, two different kinds of processes are feasible in succession by a combination of a process chamber in which a process is performed on the substrates under a condition and a different process chamber in which a different process is performed on the substrates under a different condition.

Japanese Patent Application Publication No. 2003-221671 discloses a technique in which a Ti film as a contact layer and a TiN film as a barrier layer are formed in a contact hole. In the technique disclosed in Japanese Patent Application Publication No. 2003-221671, a multi-chamber type film forming system including two Ti film forming apparatuses for forming the Ti film by chemical vapor deposition (CVD) and two TiN film forming apparatuses for forming the TiN film by CVD is used to form these films. The Ti film formation is performed by loading a wafer in the Ti film forming apparatuses. The TiN film formation is performed by loading the wafer on which the Ti film is formed in the TiN film forming apparatuses.

Reaction products are attached and deposited in inner walls and parts of the process chambers in which processes such as film formation and etching are performed. Such attachments may be peeled off and attached, as particles, to the substrates, which leads to deterioration of quality of articles.

In order to remove such attachments, there is a need to clean the interiors of the process chambers. Cleaning of the process chambers in which the film formation is performed is carried out by keeping the process chambers at a predetermined temperature and then supplying a cleaning gas such as $ClF_3$ gas, $NF_3$ gas or the like into the process chambers. After the cleaning, for the purpose of making constant process conditions to first and subsequent wafers W of a subsequent process, pre-coating is carried out to deposit a thin film in the process chambers. Processes for maintenance of environments in the process chambers, including such cleaning and pre-coating, are called "conditioning." Regular performance of such conditioning can prevent particles from being generated. A cycle of performance of the conditioning is varied depending on conditions of film formation and etching.

In the multi-chamber type substrate processing apparatus including the plurality of process chambers, conditionings are performed at respective timings in respective process chambers. The timings at which the conditionings in the process chambers are performed are not necessarily synchronized with each other. In particular, if different kinds of film forming processes are consecutively performed in combinations of plural process chambers having different film forming conditions, since cycles of performance of conditionings are varied from one process chamber to another, timings at which the conditionings in the process chambers are performed are not synchronized with each other. When the different kinds of film forming processes are consecutively performed and the timings at which the conditionings in the process chambers are performed are not synchronized with each other, there arise the following problems. In this case, first, while a conditioning is being performed in a process chamber in which a film forming process is performed (hereinafter referred to as a "previous process chamber"), a substrate cannot be transferred from the previous process chamber to a process chamber in which another film forming process is performed later (hereinafter referred to as a "posterior process chamber"), so that the film forming process for the substrate is not feasible. In addition, while a conditioning is being performed in the posterior process chamber, the substrate cannot be transferred from the previous process chamber to the posterior process chamber, so that the film forming process for a next substrate is not feasible.

Thus, while a conditioning is being performed in one of the plurality of process chambers, the film forming process for the substrate is not feasible in a separate process chamber related to the process chamber in which the conditioning is being performed. Therefore, a throughput (the number of substrates that can be processed for a unit time) of each process chamber is lowered by the sum of a time period required in the conditioning of the process chamber and a time period required in the conditioning of the separate process chamber. As a result, the overall throughput of the substrate processing apparatus is lowered.

SUMMARY OF THE INVENTION

In view of the above, the present invention provides a method for periodically conditioning the interiors of a plurality of process chambers included in a substrate processing apparatus, in which predetermined processes are performed on a substrate, thereby improving a throughput of the substrate processing apparatus, and a computer readable storage medium and a substrate processing apparatus for use with the conditioning method.

In accordance with an aspect of the present invention, there is provided a conditioning method for conditioning interiors of a plurality of process chambers of a substrate processing apparatus in which predetermined processes are performed on a substrate, the process chambers including first and second process chambers combined to perform a series of processes for the substrate, the method including: performing conditioning of the interior of the first process chamber if a first integrated value set in connection with the process of the substrate reaches a set value N1; setting the second process chamber in a standby state when the conditioning of the first process chamber starts and the series of processes is stopped; determining at least whether or not a second integrated value set in connection with process of the substrate in the second process chamber is equal to or greater than a set value N2; starting count of a third integrated value in the second process chamber if the second integrated value is equal to or greater than the set value N2; and performing a conditioning of the second process chamber if the third integrated value exceeds a set value N3.

In accordance with another aspect of the present invention, there is provided a computer readable storage medium which stores a control program executed on a computer, wherein the control program is executed to control a substrate processing apparatus including a plurality of process chambers in which predetermined processes are performed on a substrate to perform a conditioning method for conditioning the interiors of the plurality of process chambers, wherein the plurality of process chambers includes first and second process chambers combined to perform a series of processes on the substrate and the first process chamber is set to perform a conditioning if a first integrated value set in connection with the process of the substrate reaches a set value N1, and wherein the conditioning method includes: setting the second process chamber in a standby state when the conditioning of the first process chamber starts and the series of processes is stopped; determining at least whether or not a second integrated value set in connection with the process of the substrate in the second process chamber is equal to or greater than a set value N2; starting count of a third integrated value in the second process chamber if the second integrated value is equal to or greater than the set value N2; and performing a conditioning of the second process chamber if the third integrated value exceeds a set value N3.

In accordance with still another aspect of the present invention, there is provided a substrate processing apparatus comprising a plurality of process chambers in which predetermined processes are performed on a substrate, and a controller for controlling operation of the plurality of process chambers, the interiors of the plurality of process chambers being conditioned periodically, wherein: the plurality of process chambers includes first and second process chambers combined to perform a series of processes on the substrate; and the controller performs a control operation such that a conditioning is performed in the first process chamber if a first integrated value set in connection with process of the substrate reaches a set value N1, the second process chamber is set in a standby state when the conditioning of the first process chamber starts and the series of processes is stopped, and, with a condition at least where a second integrated value set in connection with process of the substrate in the second process chamber is equal to or greater than a set value N2, count of a third integrated value in the second process chamber begins and a conditioning of the second process chamber is performed if the third integrated value exceeds a set value N3.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
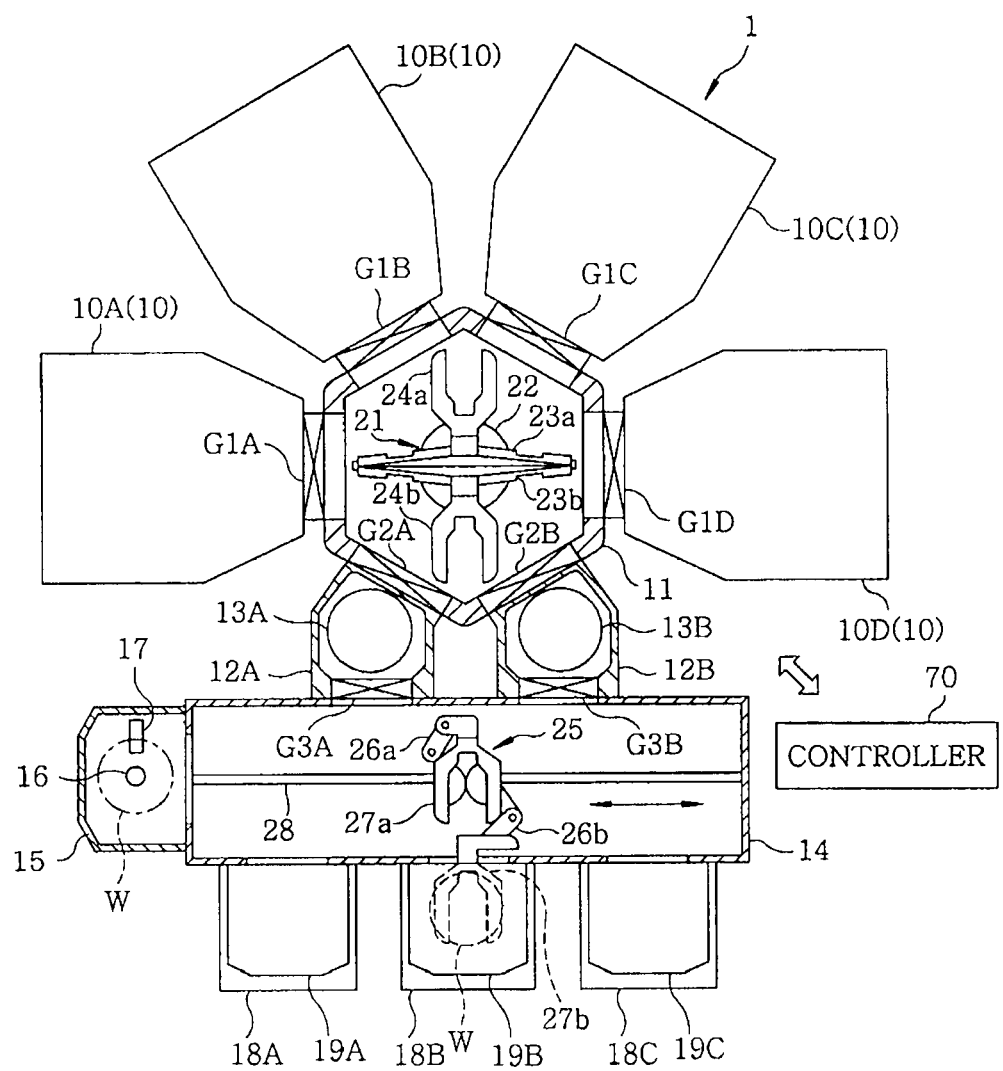
FIG. 1 is a plan view showing schematic configuration of a substrate processing apparatus according to an embodiment of the present invention.

Hereinafter, an embodiment of the present invention will be described in detail with reference to the accompanying drawings. First, configuration of a substrate processing apparatus according to one embodiment of the present invention will be described with reference to FIG. 1. FIG. 1 is a plan view showing schematic configuration of a substrate processing apparatus according to this embodiment. In this embodiment, a substrate processing apparatus 1 is an apparatus for performing predetermined processes such as film forming, diffusing, etching and so on for a substrate W for manufacture of semiconductor devices, for example, in company with a plurality of series of operations.

A substrate processing apparatus 1 includes a plurality of process modules in which a predetermined process is performed on a substrate W. In this embodiment, the substrate processing apparatus 1 includes four process modules 10A, 10B, 10C and 10D. Each of the process modules 10A, 10B, 10C and 10D includes a process chamber adapted to keep its internal space at a depressurized atmosphere (vacuum state) and devices used in performing a process in the process chamber. Detailed configuration of the process modules 10A, 10B, 10C and 10D will be described later.

The substrate processing apparatus 1 further includes a first transfer chamber 11 and two load lock chambers 12A and 12B. In this embodiment, the first transfer chamber 11 has six sides. The process modules 10A, 10B, 10C and 10D and the load lock chambers 12A and 12B are disposed adjacent to the corresponding sides of the first transfer chamber 11, respectively. In the example shown in FIG. 1, the process modules 10A, 10B, 10C and 10D and the load lock chambers 12A and 12B are disposed to be arranged clockwise in FIG. 1 in order of the process modules 10A, 10B, 10C and 10D and the load lock chambers 12B and 12A in such a manner to surround the first transfer chamber 11. The first transfer chamber 11 is configured to be kept at a depressurized atmosphere, similarly to the process chambers of the process modules 10A, 10B, 10C and 10D.

The load lock chambers 12A and 12B are configured to switch their internal space between an atmospheric state and a vacuum state. A substrate mounting table 13A for mounting thereon the substrate W is disposed within the load lock chamber 12A. A substrate mounting table 13B for mounting thereon the substrate W is disposed within the load lock chamber 12B.

The substrate processing apparatus 1 further includes gate valves G1A, G1B, G1C, G1D, G2A and G2B. The gate valve G1A is provided between the first transfer chamber 11 and the process chamber of the process module 10A. The gate valve G1B is provided between the first transfer chamber 11 and the process chamber of the process module 10B. The gate valve G1C is provided between the first transfer chamber 11 and the process chamber of the process module 10C. The gate valve G1D is provided between the first transfer chamber 11 and the process chamber of the process module 10D. The gate valve G2A is provided between the first transfer chamber 11 and the load lock chamber 12A. The gate valve G2A is provided between the first transfer chamber 11 and the load lock chamber 12B.

Each of the gate valves G1A to G1D, G2A and G2B, serves to open and close an opening provided in a partition wall between the two adjacent spaces. The gate valves G1A to G1D can air-tightly seal the respective process chambers of the respective process modules 10A, 10B, 10C and 10D in a closed state and allows the substrate W to be transferred between the respective process chambers and the first transfer chamber 11 in an opened state. The gate valves G2A and G2B can maintain air-tightness of the first transfer chamber 11 in a closed state and allows the wafer W to be transferred between the first transfer chamber 11 and the load lock chambers 12A and 12B in an opened state.

The substrate processing apparatus 1 further includes a second transfer chamber 14. The second transfer chamber 14 has a rectangular shape whose horizontal section is long in one direction (left-right direction in FIG. 1), and is such disposed that the load lock chambers 12A and 12B are interposed between the first transfer chamber 11 and the second transfer chamber 14. One side of the second transfer chamber 14 is adjacent to the load lock chambers 12A and 12B. Although not shown, the second transfer chamber 14 includes a circulator which down-flows, for example, nitrogen gas or clean air into the internal space of the second transfer chamber 14.

The substrate processing apparatus 1 further includes gate valves G3A and G3B. The gate valve G3A is provided between the load lock chamber 12A and the second transfer chamber 14. The gate valve G3B is provided between the load lock chamber 12B and the second transfer chamber 14. Each of the gate valves G3A and G3B serves to open and close an opening provided in a partition wall between the two adjacent spaces. The gate valves G3A and G3B can maintain air-tightness of the load lock chambers 12A and 12B in a closed state and allows the wafer W to be transferred between the load lock chambers 12A and 12B and the second transfer chamber 14 in an opened state.

The substrate processing apparatus 1 further includes an orienter 15 which is a device for alignment of the substrate W. The orienter 15 is connected to one end portion of the second transfer chamber 14 in a longitudinal direction. The orienter 15 includes a rotary plate 16 which is rotated by a driving motor (not shown), and an optical sensor 17 which is provided on the peripheral portion of the rotary plate 16 and detects the periphery of the substrate W.

The substrate processing apparatus 1 further includes a plurality of load ports. In the example shown in FIG. 1, the substrate processing apparatus 1 includes three load ports 18A, 18B and 18C. The load ports 18A, 18B and 18C are disposed adjacent to a side of the second transfer chamber 14 opposite to a side thereof adjacent to the load lock chambers 12A and 12B. Cassette containers 19A, 19B and 19C can be loaded on the load ports 18A, 18B and 18C, respectively. Substrates W can be arranged in multiple stages in each of the cassette containers 19A, 19B and 19C with vertical gaps therebetween.

The substrate processing apparatus 1 further includes a first transfer device 21 disposed in the first transfer chamber 11 and a second transfer device 25 disposed in the second transfer chamber 14. The first transfer device 21 is used to transfer the substrates W between the process chambers of the process modules 10A, 10B, 10C and 10D and the load lock chambers 12A and 12B. The second transfer device 25 is used to transfer the substrates W between the cassette containers 19A, 19B and 19C of the load ports 18A, 18B and 18C, the load lock chambers 12A and 12B, and the orienter 15.

The first transfer device 21 includes a base 22, a pair of transfer arms 23a and 23b which are connected to the base 22, a fork 24a provided in a leading end of the transfer arm 23a, and a fork 24b provided in a leading end of the transfer arm 23b. The transfer arms 23a and 23b are configured to extend/contract and pivot around a shaft of the base 22. The forks 24a and 24b act as holding members for mounting and holding the substrates W. The first transfer device 21 transfers the substrates W mounted on the forks 24a and 24b.

The second transfer device 25 is configured to be movable along a guide rail 28 disposed in the second transfer chamber 14 in the longitudinal direction of the second transfer chamber 14 (horizontal direction in FIG. 1). The second transfer device 25 includes a pair of transfer arms 26a and 26b which are vertically arranged in two-stage, a fork 27a provided in a leading end of the transfer arm 26a, and a fork 27b provided in a leading end of the transfer arm 26b. The transfer arms 26a and 26b are configured to extend/contract and pivot. The forks 27a and 27b act as holding members for mounting and holding the substrates W. The second transfer device 25 performs the transfer of the substrates W with the substrates W mounted on the forks 27a and 27b.

The substrate processing apparatus 1 further includes a controller 70 which is connected with and controls the components of the substrate processing apparatus 1. Configuration of the controller 70 will be described later.

Figure 2:
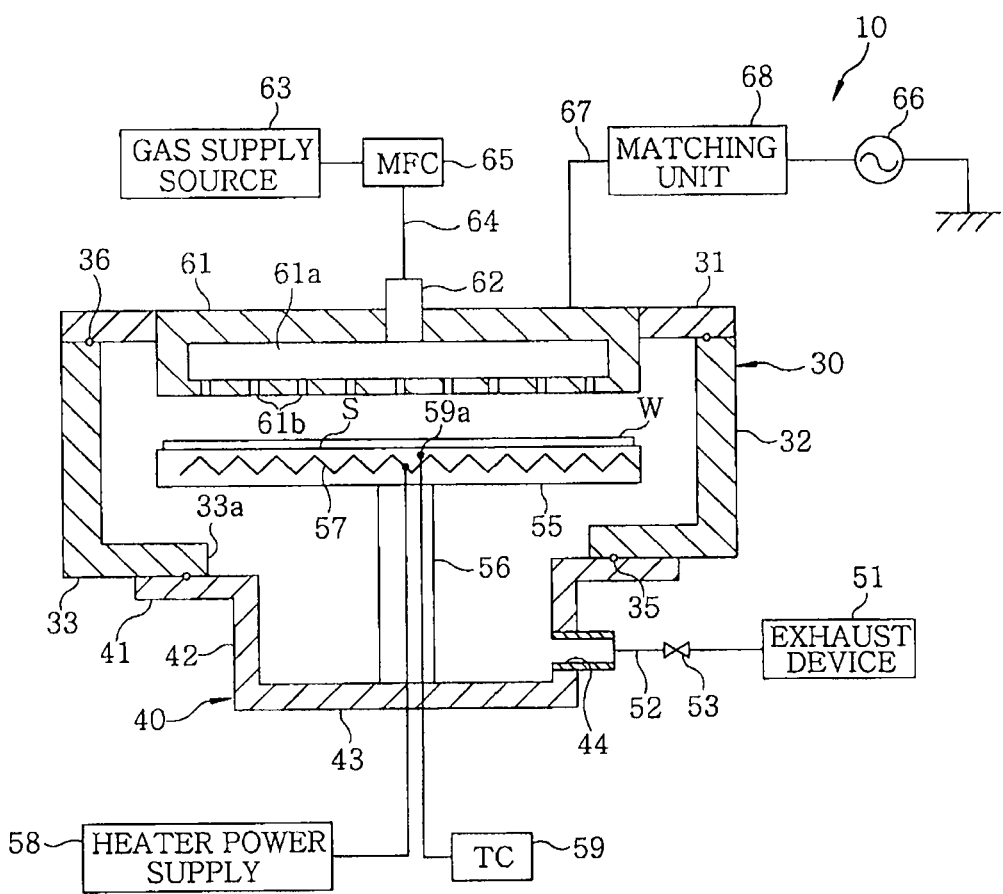
FIG. 2 is a sectional view showing configuration of a process module according to the embodiment of the present invention.

Next, configuration of the process modules 10A, 10B, 10C and 10D will be described in detail with reference to FIG. 2. FIG. 2 is a sectional view showing configuration of a process module according to this embodiment. In the process modules 10A, 10B, 10C and 10D, predetermined processes such as film forming, diffusion, etching and so on are performed on the substrates W. In this embodiment, different processes are performed in at least two of the process modules 10A, 10B, 10C and 10D. In this embodiment, the process modules 10A, 10B, 10C and 10D have the same structure. Hereinafter, the process module is generally denoted by reference numeral 10.

The process module 10 includes a process chamber 30 in which a substrate W is subjected to a predetermined process, and an exhaust chamber 40 connected to the process chamber 30. The process chamber 30 of the process module 10A corresponds to a first process chamber in the present invention. The process chamber 30 of the process module 10B corresponds to a second process chamber in the present invention. The process chamber 30 of the process module 10C corresponds to a third process chamber in the present invention. The process chamber 30 of the process module 10D corresponds to a fourth process chamber in the present invention.

The process chamber 30 has a plate-like ceiling 31, a plate-like bottom 33 and a side wall 32 connecting the ceiling 31 and the bottom 33. The process chamber 30 has, for example, a cylindrical shape. Although not shown, the side wall 32 of the process module 10 has a loading/unloading port through which the substrate W is transferred to and from the first transfer chamber 11 (see FIG. 1). When the gate valve (see FIG. 1) provided between the process chamber 30 of the process module 10 and the first transfer chamber 11 is opened, the substrate W can be transferred through the loading/unloading port. An opening 33a is formed in the center portion of the bottom 33. The exhaust chamber 40 is connected to the bottom 33 such that the exhaust chamber 40 covers the opening 33a.

The exhaust chamber 40 includes an annular flange 41, a plate-like bottom 43, and a side wall 42 connecting the flange 41 and the bottom 43. The flange 41 is joined to the bottom 33 of the process chamber 30. An exhaust hole 44 is formed in the side wall 42.

The process chamber 30 and the exhaust chamber 40 are configured to keep their internal spaces at a depressurized atmosphere (vacuum state). O-rings as sealing members are disposed in a joining portion between the process chamber 30 and the exhaust chamber 40 and in joining portions between members constituting the process chamber 30 and the exhaust chamber 40 for the purpose of securing their air-tightness. In the example shown in FIG. 2, an annular O-ring 35 is disposed in the joining portion between the process chamber 30 and the exhaust chamber 40, more specifically, a joining portion between the bottom 33 of the process chamber 30 and the flange 41 of the exhaust chamber 40. In addition, an annular O-ring 36 is disposed in a joining portion between the ceiling 31 and the side wall 32 of the process chamber 30.

The process module 10 further includes an exhaust device 51 disposed in the outside of the process chamber 30 and the exhaust chamber 40, an exhaust pipe 52 connecting the exhaust hole 44 and the exhaust device 51, and a valve 53 disposed in the course of the exhaust pipe 52. The valve 53 can maintain air-tightness of the process chamber 30 and the exhaust chamber 40 in a closed state and allow internal pressures of the process chamber 30 and the exhaust chamber 40 to be reduced by means of the exhaust device 51 in an opened state. The internal pressures of the process chamber 30 and the exhaust chamber 40 are reduced to a predetermined degree of vacuum by actuation of the exhaust device 51.

The process module 10 further includes a susceptor 55 disposed within the process chamber 30, and a support member 56 for supporting the susceptor 55 in the process chamber 30 and the exhaust chamber 40. The susceptor 55 is a substrate mounting table to support the substrate W horizontally. The susceptor 55 has a substrate mounting surface S on which the substrate W is mounted, and an opposing lower surface. One end of the support member 56 is fixed to the central portion of the lower surface of the susceptor 55. The other end of the support member 56 is fixed to the bottom 43 of the exhaust chamber 40.

Although not shown, the susceptor 55 has a plurality of support pins provided to protrude beyond and retract below the substrate mounting surface S. The support pins are configured to be vertically movable by means of any elevating mechanism to transfer and receive the substrate W to and from the first transfer device 21 in a raised position.

The process module 10 further includes a heater 57, a heater power supply 58 and a thermocouple (TC) 59. The heater 57 and a temperature measuring part 59a of the thermocouple 59 are buried in the susceptor 55. The heater power supply 58 is disposed in the outside of the process chamber 30 and the exhaust chamber 40. The heater 7 is connected to the heater power supply 58 via a wiring passing through the interior of the support member 56. The heater power supply 58 supplies electrical power to the heater 57 to heat the substrate W mounted on the susceptor 55 to a predetermined temperature. The temperature of the susceptor 55 is measured by the thermocouple 59.

The process module 10 further includes a shower head 61 provided in the ceiling 31 of the process chamber 30. The shower head 61 has a gas diffusion space 61a formed therein and a plurality of gas injection holes 61b extended therethrough from the gas diffusion space 61a toward the susceptor 55.

The process module 10 further includes a gas introduction pipe 62 which is provided in the opposite side to the gas injection holes 61b in the shower head 61 and communicates with the gas diffusion space 61a, a gas supply source 63 disposed in the outside of the process chamber 30 and the exhaust chamber 40, a gas pipeline 64 connecting the gas introduction pipe 62 and the gas supply source 63, a mass flow controller (MFC) 65 provided in the course of the gas pipeline 64, and a valve (not shown). The gas supply source 63 supplies the shower head 61 with a film forming material gas used for film forming, a cleaning gas used to clean the interiors of the process chamber 30 and the exhaust chamber 40, a purge gas used to replace atmospheres in the process chamber 30 and the exhaust chamber 40, and so on. These gases are supplied to the gas diffusion space 61a via the gas pipeline 64 and the gas introduction pipe 62 and are injected into the process chamber 30 through the gas injection holes 61b.

The process module 10 further includes a high-frequency power supply 66 disposed in the outside of the process chamber 30 and the exhaust chamber 40, a wiring 67 connecting the shower head 61 to the high-frequency power supply 66, and a matching device 68 provided in the course of the wiring 67. The high-frequency power supply 66 supplies the shower head 61 with a high-frequency power used for plasmarization of the film forming material gas supplied into the process chamber 30.

In the above-configured process module 10, a particular film such as a Ti film, a TiN film or the like may be formed on a surface of the substrate W by using, for example, chemical vapor deposition (CVD). One example of a method of forming the film will be described below. In this method, the interiors of the process chamber 30 and the exhaust chamber 40 are first set to a vacuum state. Then, the substrate W is mounted on the susceptor 55. Subsequently, the substrate W is heated by the heater 57. Next, a film forming material gas is supplied to the substrate W through the shower head 61 (gas injection holes 61b). Thus, the film is formed on the surface of the substrate W. In addition, in order to accelerate a film forming reaction, high-frequency power may be supplied from the high-frequency power supply 66 to the shower head 61. This makes it possible to plasmarize the film forming material gas supplied into the process chamber 30 through the shower head 61.

Figure 3:
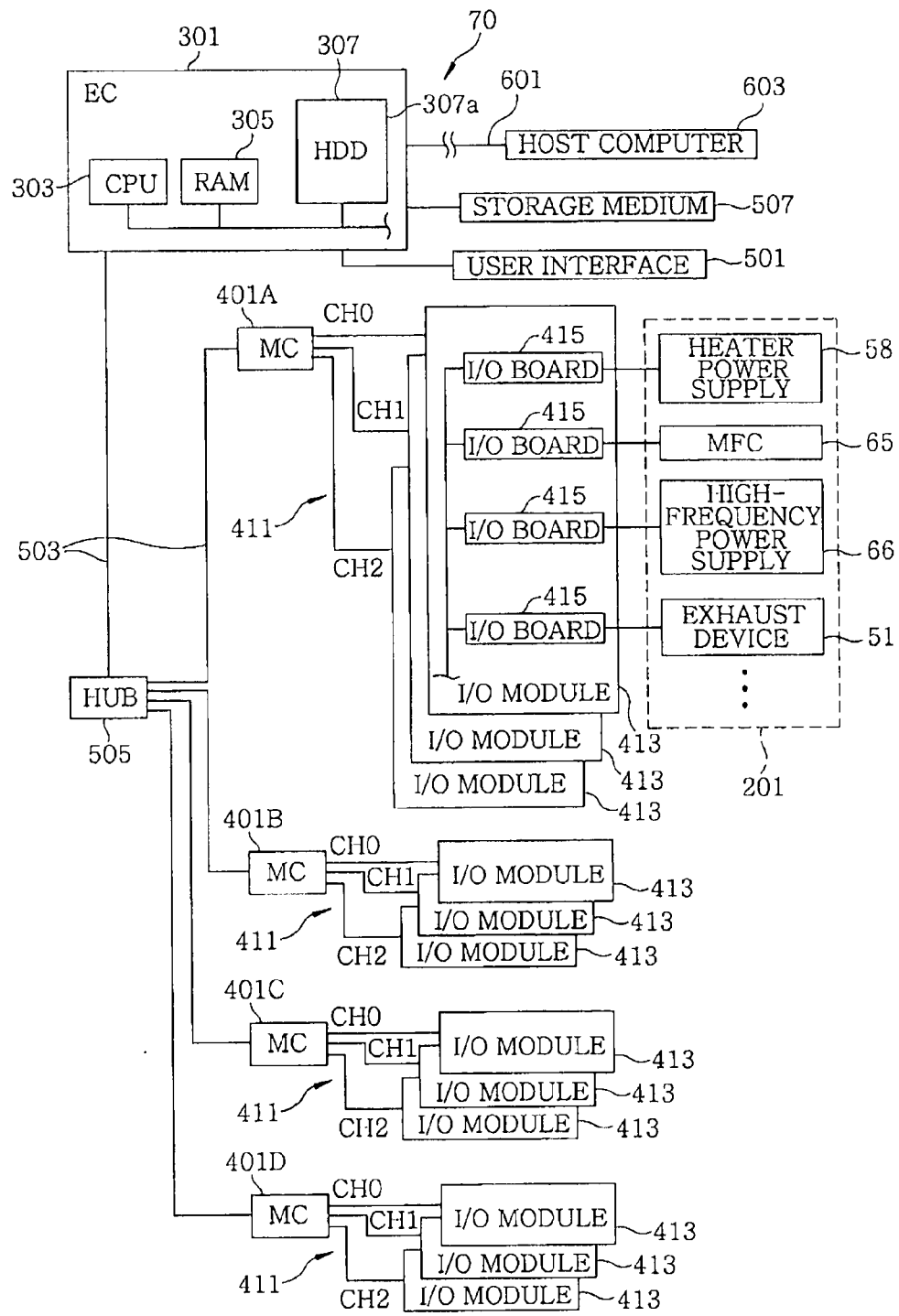
FIG. 3 is a view showing an example of the entire configuration of a controller of the substrate processing apparatus shown in FIG. 1.
Figure 4:
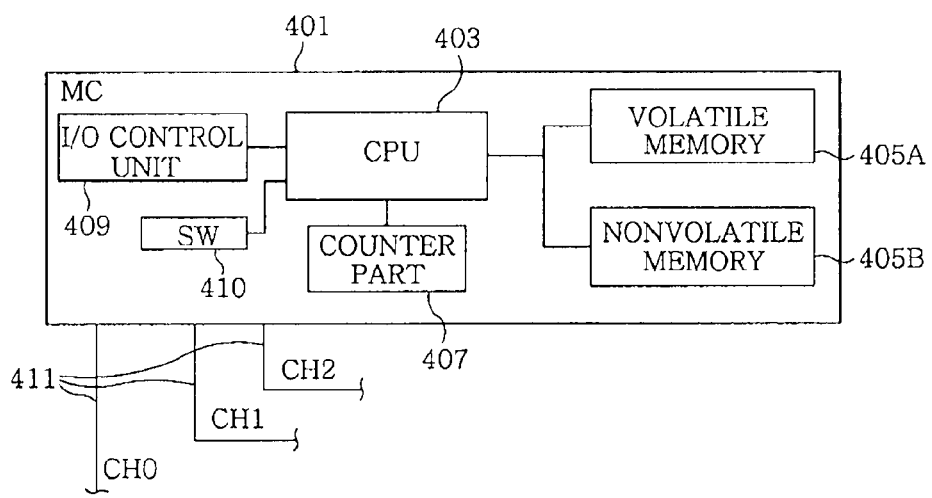
FIG. 4 is a view showing an example of partial configuration of the controller of the substrate processing apparatus shown in FIG. 1.

FIGS. 3 and 4 show general configuration of a control system in the substrate processing apparatus 1. The controller 70 performs the entire control in the substrate processing apparatus 1 and controls of various components, that is, end devices 201, constituting the process module 10 as a process chamber. Here, examples of the end devices 201 may include the heater power supply 58, the MFC 65, the high-frequency power supply 66, the exhaust device 51 and so on in the process module 10.

As shown in FIG. 3, the controller 70 includes, as main elements, four module controllers (MCs) 401A, 401B, 401C and 401D (hereinafter sometimes collectively referred to as "MCs 401") which are individual control units provided in correspondence with the process module 10, an equipment controller (EC) 301 which is a general controller for controlling the entire operation of the substrate processing apparatus 1, and a user interface 501 connected to the EC 301. MCs 401 may be provided for, for example, the load lock chambers 12A and 12B and so on as well as the process module 10 under the general control of the EC 301, which will not be shown and described herein.

The EC 301 and the MCs 401 are connected via an intra-system local area network (LAN) 503. The intra-system LAN 503 has a switching hub (HUB) 505. The switching hub 505 executes switching of the MCs 401 as connection destinations of the EC 301 according to a control signal from the EC 301.

The EC 301 is a general controller which controls the entire operation of the substrate processing apparatus 1. The EC 301 controls each of the MC 401s. The EC 301 includes a central processing unit (CPU) 303, a random access memory (RAM) 305 as a volatile memory, and a hard disk drive (HDD) 307 as a storage unit. The storage unit is not limited to the HDD 307 but may be a different nonvolatile memory.

The EC 301 is connected, via an LAN 601, to a host computer 603 as a manufacturing execution system (MES) which controls the entire manufacturing process of a factory in which the substrate processing apparatus 1 is installed. In cooperation with the controller 70, the host computer 603 feeds back real time information on various processes in the factory to a line-of-business system (not shown) and makes a determination on the processes in consideration of an overall load of the factory.

The user interface 501 is also connected to the EC 301. The user interface 501 includes a keyboard to allow a process administrator to input commands for control of the substrate processing apparatus 1, a display for visually displaying operation situations of the substrate processing apparatus 1, a mechanical switch to cause the EC 301 to execute the commands, and so on.

The EC 301 is adapted to write information on a computer readable storage medium (hereinafter abbreviated as "storage medium") 507 and read the information from the storage medium 507. The information, for example, a control program and recipes, may be installed from the storage medium 507 into the hard disk drive 307 as a storage unit. Examples of the storage medium 507 may include a compact disk (CD) ROM, a hard disk, a flexible disk, a flash memory, a DVD and so on. The recipes may be frequently received on-line from other apparatuses via a dedicated line.

In the EC 301, the CPU 303 reads, from the hard disk drive 307 or the storage medium 507, programs (software) including recipes regarding a substrate processing method designated by a user or the like in the user interface 501. Then, the programs are sent from the EC 301 to the MCs 401 to control processes in the process modules 10A to 10D.

The MCs 401 are provided as individual control units to control operation of the respective process modules 10A to 10D. The MCs 401A to 401D control the process modules 10A to 10D, respectively.

Each of the MCs 401 includes a CPU 403, a volatile memory 405A such as a RAM, a nonvolatile memory 405B, a counter part 407, an input/output (I/O) control unit 409 and a switch (SW) 410. The nonvolatile memory 405B of the MC 401 may be a nonvolatile memory such as SRAM, MRAM, EEPROM, a flash memory or the like. The nonvolatile memory 405B stores a variety of history information in the process modules 10A to 10D, for example, the number of the processed substrate W, the total supply amount of each process gas from the gas supply source 63, and so on.

The counter part 407 counts elapsed time as a third integrated value with the end device 201 of each process module 10 kept at a standby state, as will be described later.

The I/O control unit 409 of the MC 401 sends various control signals to I/O modules 413, which will be described later, or receives signals such as status information related to each end device 201 from the I/O modules 413.

Control of each end device 201 by the MC 401 is performed through the I/O modules 413. The I/O modules 413 perform transfer of a control signal to each end device 201 and an input signal from the end device 201. Each MC 401 is connected to the respective I/O modules 413 via a network 411. The network 411 connected to each MC 401 includes a plurality of channels such as, for example, channels CH0, CH1 and CH2.

Each I/O module 413 includes a plurality of I/O boards 415 (only four of them being shown in FIG. 3) connected to the end devices 201 constituting each of the process modules 10A to 10D. Control of input/output of digital signals, analog signals and serial signals in the I/O module 413 is performed in these I/O boards 415. For the sake's convenience of description, connection between some end devices 201 and some corresponding I/O boards 415 is only represented in FIG. 3.

Input/output information managed in each I/O board 415 includes four kinds of information, i.e., digital input information DI, digital output information DO, analog input information AI and analog output information AO. The digital input information DI relates to digital information input to an MC 401 located at an upper level of the control system from each end device 201 located at a lower level of the control system. The digital output information DO relates to digital information output to each end device 201 located at a lower level of the control system from an MC 401 located at an upper level of the control system. The analog input information AI relates to analog information input to an MC 401 from each end device 201. The analog output information AO relates to analog information output to each end device 201 from an MC 401.

The digital input information DI and the analog input information AI include information related to a status of each end device 201, for example. The digital output information DO and the analog output information AO include instructions (commands) related to process conditions and so on set in each end device 201, for example. For example, the digital information may include information on ON/OFF of the heater power supply 58, open/close of a valve (not shown) of the MFC 65, ON/OFF of the high-frequency power supply 66, ON/OFF of the exhaust device 51, open/close of valves (not shown) in an exhaust system, and so on. The analog information may include information on set temperature of the heater 57, a set flow rate in the MFC 65.

In the above-configured controller 70, the I/O modules 415 connected to the respective end devices 201 are modularized into one I/O module 413. This I/O module 413 is connected to the EC 301 via the MC 401 and the switching hub 505. In this manner, hierarchy of the control system can be realized by connection of the end devices 201 to the EC 301 not directly but via the IC module 413 and the MC 401.

Figure 5:
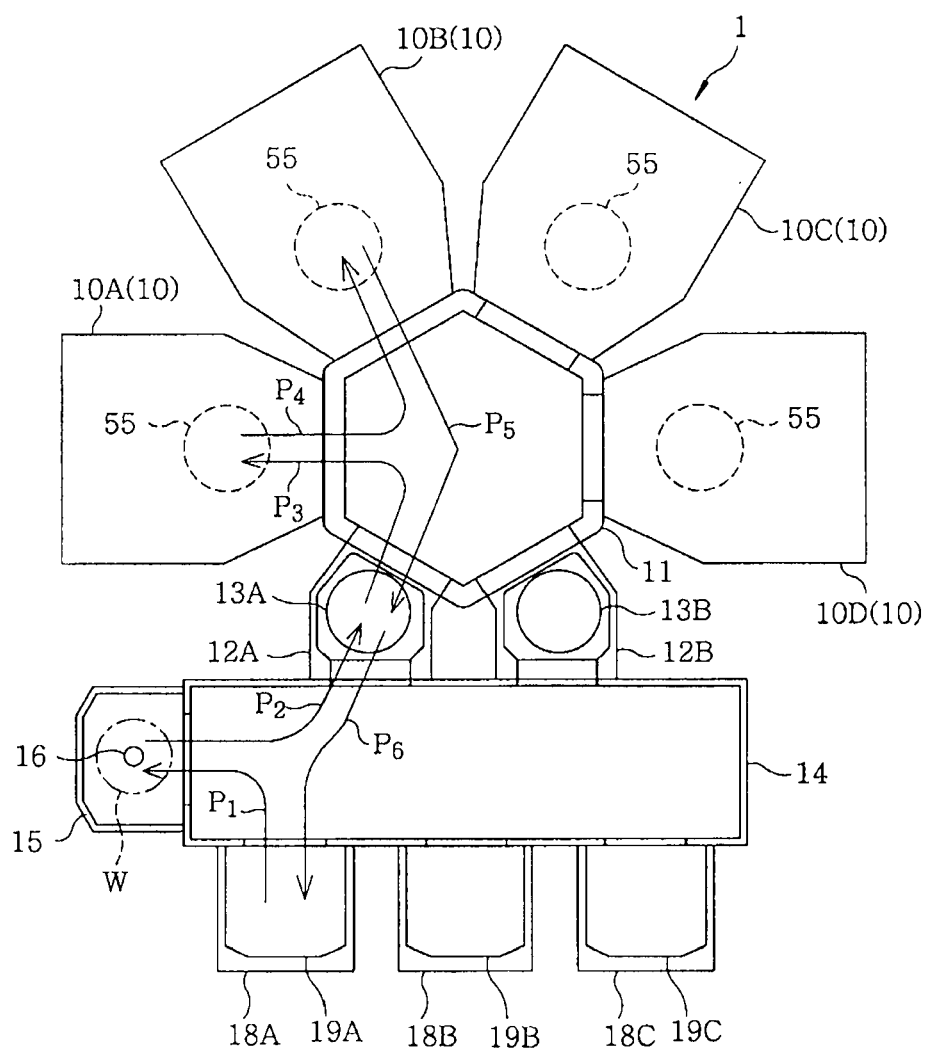
FIG. 5 is an explanatory view showing operation of the substrate processing apparatus according to the embodiment of the present invention.

Next, operation of the substrate processing apparatus 1 will be described with reference to FIG. 5. FIG. 5 is an explanatory view showing operation of the substrate processing apparatus 1. In FIG. 5, arrows affixed with '$P_1$', '$P_2$', '$P_3$', '$P_4$', '$P_5$' and '$P_6$' indicate routes of a substrate W. In this embodiment, a series of processes for the substrate W is performed by a combination of the process modules 10A and 10B. The series of processes for the substrate W is also performed by a combination of the process modules 10C and 10D. In this embodiment, the series of processes in the process modules 10C and 10D is the same as the series of processes in the process modules 10A and 10B. In the following description, the series of processes in the process modules 10A and 10B will be described on behalf of these series of processes. The series of processes for the substrate W will be described by example of a process of consecutively forming a Ti film and a TiN film on a surface of the substrate W by CVD.

The series of processes for the substrate W includes a process of forming the Ti film on the substrate W in the process module 10A (hereinafter referred to as a "first film forming process") and a process of forming the TiN film on the substrate W in the process module 10B after the first film forming process (hereinafter referred to as a "second film forming process").

As shown in FIG. 5, in this series of processes, first, one substrate W is taken out of the cassette container 19A and subsequently is loaded in the orienter 15 by the second transfer device 25 (see FIG. 1) (route $P_1$). Then, the substrate W is aligned in the orienter 15. Next, the substrate W is unloaded from the orienter 15 and subsequently is loaded in the load lock chamber 12A by the second transfer device 25 (route $P_2$). The substrate W is mounted on the substrate mounting table 13A.

Next, the substrate W mounted on the substrate mounting table 13A is unloaded from the load lock chamber 12A and subsequently is loaded in the process chamber 30 of the process module 10A by the first transfer device 21 (see FIG. 1) (route $P_3$). The substrate W is mounted on the susceptor 55 of the process module 10A. Next, the first film forming process is performed on the substrate W in the process module 10A.

Next, the substrate W is unloaded from the process chamber 30 of the process module 10A and subsequently is loaded in the process chamber 30 of the process module 10B by the first transfer device 21 (route $P_4$). The substrate W is mounted on the susceptor 55 of the process module 10B. Next, the second film forming process is performed on the substrate W in the process module 10B.

Next, the substrate W is unloaded from the process chamber 30 of the process module 10B and subsequently is loaded in the load lock chamber 12A by the first transfer device 21 (route $P_5$). The substrate W is mounted on the substrate mounting table 13A. Next, the substrate W mounted on the substrate mounting table 13A is unloaded from the load lock chamber 12A and subsequently is stored in the cassette container 19A by the second transfer device 25 (route $P_6$).

In the process modules 10C and 10D, in parallel with the series of processes in the process modules 10A and 10B, the same processes as this series of processes may be performed on another substrate W.

Next, a conditioning method according to this embodiment will be described. In the conditioning method according to this embodiment, in case of repeatedly conditioning the interiors of the process chambers 30 of the process modules 10 at certain intervals (preferably at a predetermined cycle), when conditioning of the process module 10A starts and a series of processes is stopped, conditioning is performed at an appropriate timing for the process module 10B performing the series of processes (hereinafter sometimes being referred to as a "relevant conditioning"). As the series of processes, it is here illustrated that the above-described first film forming process is performed on the substrate W in the process module 10A and the above-described second film forming process is performed on the substrate W in the process module 10B. The number of substrates W processed (without any conditioning) between any conditioning and a next conditioning in the process module 10A or the process module 10B is referred to as the "number of consecutively processed substrates").

Cleaning of the process module 10 is carried out to remove reaction products adhered to the inner walls of the process chamber 30 and the exhaust chamber 40 and various members disposed in the process chamber 30 and the exhaust chamber 40 due to the film forming process. Cleaning of the interiors of the process chamber 30 and the exhaust chamber 40 is performed by keeping the process chamber 30 and the exhaust chamber 40 at a predetermined temperature and then supplying a cleaning gas such as $ClF_3$ gas or the like into the process chamber 30 and the exhaust chamber 40 through the shower head 61 (the gas injection holes 61b). After the cleaning, for the purpose of making constant process conditions to first and subsequent substrates W of a subsequent process, pre-coating is carried out to deposit a thin film in the process chamber 30. The pre-coating is carried out by supplying film forming material gas through the shower head 61 (the gas injection holes 61b). The conditioning including the cleaning and the pre-coating is performed with an interval after a plurality of substrates W is processed. Typically, the conditioning interval is set based on values set in connection with processes of the substrates W, for example, the number of the processed substrates W, a total flow rate of the process gas, and so on.

(Integrated Value and Set Value)

Integrated values and set values related to conditioning of the process modules 10A and 10B will be now described. In this embodiment, first to third integrated values and four set values N1 to N4 are defined for the conditioning of the process modules 10A and 10B. The first integrated value is a value set in connection with process of the substrate W in the process module 10A. The second integrated value is a value set in connection with process of the substrate W in the process module 10B. In this embodiment, examples of the "value set in connection with process of the substrate W" may include the number of the processed substrates W, a total flow rate of the gas used for a plurality of substrates W, a total thickness of films formed on a plurality of substrates W, and so on. If the series of processes include an etching process, examples of the "value set in connection with process of the substrate W" may include a total etching rate for a plurality of substrates W. In this embodiment, the first and second integrated values are defined by the number of substrates W processed consecutively from previous conditioning. For example, the first integrated value is integrated whenever one substrate W is processed in the process module 10A and becomes zero as conditioning of the process module 10A is performed. The second integrated value is integrated whenever one substrate W is processed in the process module 10B and becomes zero as conditioning of the process module 10B is performed. For example, information on the first and second integrated value is stored in the nonvolatile memory 405B of the MC 401.

The set value N1 corresponds to the first integrated value and is a value set in connection with process of the substrate W. In the process module 10A, conditioning is performed when the first integrated value reaches the set value N1. In this embodiment, the set value N1 corresponds to the number of substrates W processed between any conditioning and the next conditioning in the process module 10A.

The set value N2 corresponds to the second integrated value and is a value set in connection with process of the substrate W. The set value N2 is used to perform the relevant conditioning at an appropriate timing in the process module 10B when conditioning of the process module 10A starts and a series of processes is stopped. Specifically, with a condition that the second integrated value is equal to or greater than the set value N2, count of the third integrated value begins as a preliminary step for performing conditioning in the process module 10B. Here, if the set value N2 is equal to the set value N1 (N2=N1), a significant difference between a conditioning cycle of the process module 10A and a conditioning cycle of the process module 10B is prevented.

The third integrated value is an integrated value of elapsed time counted during an idle state (standby state) of the process module 10B when conditioning of the process module 10A starts and a series of processes is stopped. Count of the third integrated value is carried out in the counter part 407 of the MC 401, for example. The set value N3 corresponds to the third integrated value and is a value related to elapsed time. The set value N3 is used to perform the relevant conditioning at an appropriate timing in the process module 10B when conditioning of the process module 10A starts and a series of processes is stopped. If the third integrated value exceeds the set value N3, the conditioning in the process module 10B is performed.

The set value N4 corresponds to the second integrated value and is a value set in connection with process of the substrate W. In the process module 10B, conditioning is performed independently of the conditioning of the process module 10A when the second integrated value reaches the set value N4. In this embodiment, the set value N4 corresponds to the number of substrates W processed between any conditioning and the next conditioning in the process module 10B when the conditioning is performed independently of the conditioning of the process module 10A.

As described above, in this embodiment, the conditioning of the process module 10A is performed when the first integrated value set in connection with the process of the substrate W reaches the set value N1. In this embodiment, the conditioning of the process module 10B is classified into two types. A first type is the relevant conditioning performed at an appropriate time using the second and third integrated values and the set value N3 when conditioning of the process module 10A starts and a series of processes is stopped. A second type is a normal conditioning performed using the second integrated value and the set value N4. The conditioning method of this embodiment is preferably applied to a case where the set value N1, which is the number of substrates W processed without any conditioning in the process module 10A, is smaller than the set value N4, which is the number of substrates W processed without any conditioning in the process module 10B, (N1<N4). For example, the set value N1 of the process module 10A may be 500 and the set value N4 of the process module 10B may be 1000.

In this embodiment, a value obtained by subtracting the set value N1 of the process module 10A from the set value N4 of the process module 10B is preferably used as the set value N2. In this example, the set value N2 is 500 (N4−N1, i.e., 1000−500). The reason for setting the set value N2 to be equal to the value obtained by subtracting the set value N1 of the process module 10A from the set value N4 of the process module 10B will be described later.

Next, determination on whether or not to perform the relevant conditioning in the process module 10B will be described in detail. It is here assumed that the set value N1 of the process module 10A is 500 and the set value N4 of the process module 10B is 1000. As described above, the determination on whether or not to perform the relevant conditioning in the process module 10B is made by the controller 70.

Figure 6A:
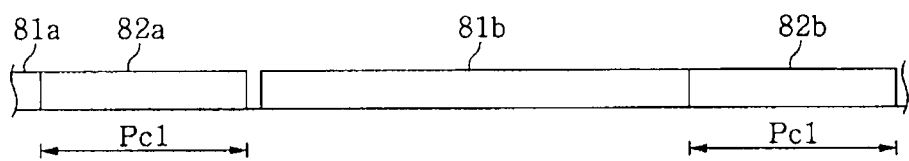
FIGS. 6A and 6B are schematic explanatory views showing a flow of processes in process modules according to an embodiment of the present invention.
Figure 6B:
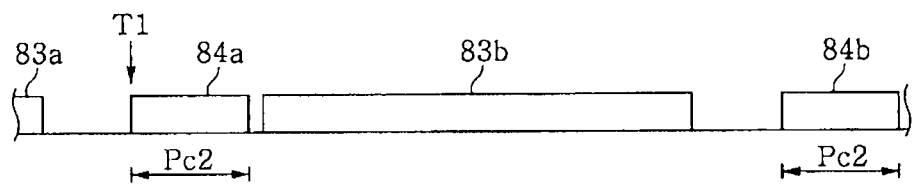

FIGS. 6A and 6B are schematic explanatory views showing a flow of processes in the process modules 10A and 10B. FIG. 6A shows a flow of process of the process module 10A. FIG. 6B shows a flow of process of the process module 10B. In FIGS. 6A and 6B, reference numerals 81a and 81b denote a period of time during which the first film forming process is repeatedly performed on a plurality of substrates W in the process module 10A, reference numerals 82a and 82b denote a period of time during which conditioning of the process module 10A is performed, reference numerals 83a and 83b denote a period of time during which the second film forming process is repeatedly performed on the plurality of substrates W in the process module 10B, and reference numerals 84a and 84b denote a period of time during which conditioning of the process module 10B is performed. In FIGS. 6A and 6B, a period of time during which the first and second film forming processes and the conditioning are not performed is a period of time during which the process module 10A or the process module 10B is in an idle state (standby state).

In the process module 10A, time required for one conditioning (hereinafter referred to as "first conditioning time Pc1") is varied depending on film forming conditions and the like of the first film forming process. Likewise, in the process module 10B, time required for one conditioning (hereinafter referred to as "second conditioning time Pc2") is varied depending on film forming conditions and so on of the second film forming process. In the process module 10A in which the first film forming process is performed, the first conditioning time Pc1 is set to, for example, 6.5 hours. In the process module 10B in which the second film forming process is performed, the second conditioning time Pc2 is set to, for example, 3.5 hours.

Thus, in this embodiment, the first conditioning time Pc1 is set to be longer than the second conditioning time Pc2. In this case, the conditioning of the process module 10B is preferably performed at least from a point T1 elapsed by a subtraction of the second conditioning time Pc2 from the first conditioning time Pc1 (Pc1−Pc2) from a point when the conditioning of the process module 10A starts and the series of processes is stopped. In the above example, the conditioning of the process module 10B is preferably performed at least from a point elapsed by three hours from a point when the conditioning of the process module 10A starts. As a result, the conditionings of the process modules 10A and 10B can be substantially simultaneously completed, so that a next film forming process can be performed with no delay after the conditionings.

At a point at which the number of consecutively processed substrates in the process module 10A reaches, for example, the set value N1, the conditioning 82a in the process module 10A starts, as shown in FIG. 6A. Upon detecting the start of the conditioning of the process module 10A, the controller 70 sets the process module 10B, which is a different process module performing the series of processes, to the idle state. With a condition where at least the number of consecutively processed substrates in the process module 10B is equal to or greater than a set number (for example the set value N2), if the idle state lasts for a predetermined time (3 hours in this example) in the process module 10B, the conditioning 84a of the process module 10B starts. After the conditionings of the process modules 10A and 10B are completed, the first film forming process 81b of a next cycle begins in the process module 10A, and, in substantial synchronization therewith, the second film forming process 83b of a next cycle begins in the process module 10B. Next, at a point at which the number of consecutively processed substrates in the process module 10A reaches the set value N1, the conditioning 82b in the process module 10A starts and the controller 70 sets the process module 10B to the idle state. In the process module 10B, the idle state lasts for the predetermined time. After lapse of the predetermined time, if the number of consecutively processed substrates in the process module 10B is equal to or greater than the set number (for example the set value N2), the conditioning 84b of the process module 10B starts.

Figure 7:
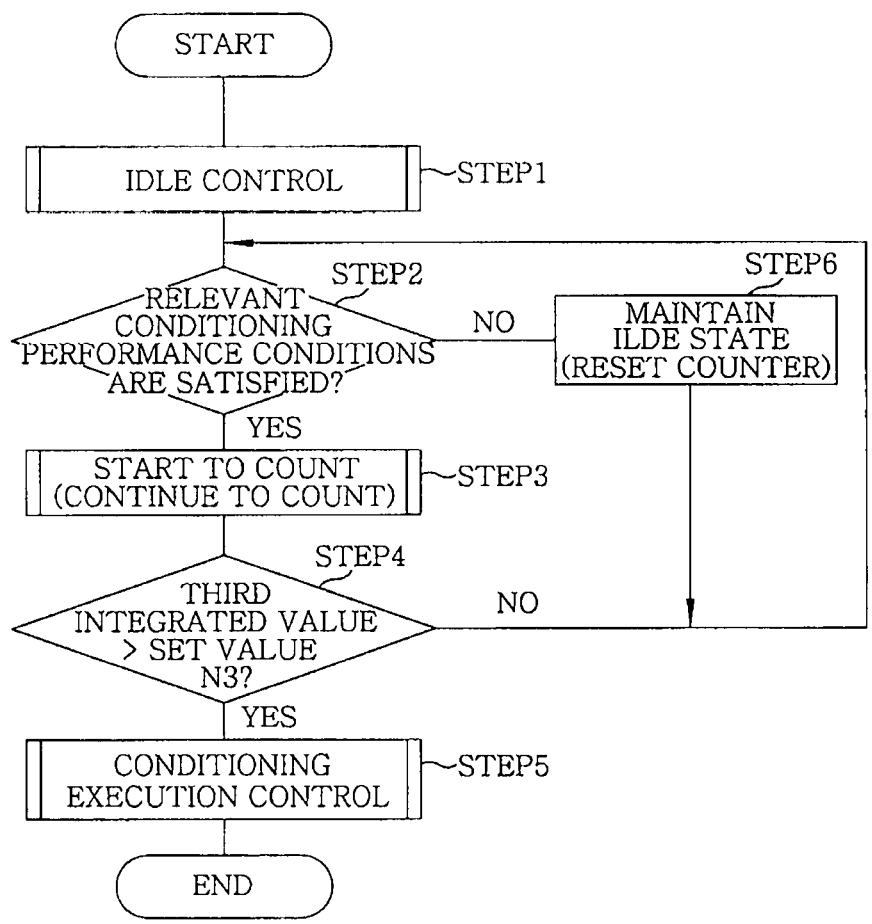
FIG. 7 is a flowchart showing an example of control sequence including a conditioning method according to an embodiment of the present invention.

A timing at which the relevant conditioning in the process module 10B is performed is determined by the controller 70, as will be described below. FIG. 7 is a flowchart showing a control sequence including the relevant conditioning performed in the process module 10B.

The conditioning of the process module 10A starts by using the first integrated value and set value N1 as initial values. Based on this information, the EC 301 recognizes the process module 10B paired with the process module 10A and sends a command to the MC 401B to change a status of the process module 10B to an idle state.

In STEP 1, the MC 401B receives the command from the EC 301 and sets the process module 10B to the idle state (idle control). This process is well-known in the art, and detailed explanation of which will be omitted.

Next, in STEP 2, the MC 401B determines whether or not to satisfy conditions on performance of the relevant conditioning (relevant conditioning performance conditions). Here, the relevant conditioning performance conditions include determination on whether or not at least the number of consecutively processed substrates in the process module 10B is equal to or greater than the set number (the set value N2). The relevant conditioning performance conditions include preferably two or more of the following items (1) to (5), with item (1) included as an essential item, more preferably all of the items (1) to (5).

(1) The number of consecutively processed substrates in the process module 10B is equal to or greater than the set number (the set value N2).

(2) The process module 10B is in the idle state.

(3) The process module 10A is under conditioning.

(4) Function of the relevant conditioning is valid (ON).

(5) The process chamber 30 of the process module 10B is not in a state which does not require conditioning (a cleaning state). Here, an example of the cleaning state may include a state where pre-coating is completed before the substrate W is processed.

If it is determined that the relevant conditioning performance conditions are satisfied (Yes in STEP 2), in STEP 3, the MC 401B begins to count the third integrated value as elapsed time until the conditioning of the process module 10B starts. By performance of the counting of the third integrated value, a starting point of the relevant conditioning of the process module 10B can be delayed and, preferably, an end of the conditioning of the process module 10A can be substantially synchronized with an end of the conditioning of the process module 10B. Accordingly, in the process modules 10A and 10B, a film forming process after the conditioning can be started with no delay. In addition, even though the end of the conditioning of the process module 10A is not synchronized with the end of the conditioning of the process module 10B, since timings of start and end of the conditioning in the process module 10B can be arbitrarily adjusted by the count of the third integrated value (and the set value N3), time of the conditioning in the process module 10B can be properly managed. For example, by delaying an end of the conditioning in the process module 10B by the amount of time required for process of one substrate W in the process module 10A, end time of the conditioning of the process module 10B can be synchronized with end time of process of a first substrate W after the conditioning in the process module 10A. In addition, if an error occurs and the conditioning is stopped in the process module 10A in which the conditioning starts first, there is an advantage in that wasteful conditioning may not be performed in the process module 10B by stopping the count of the third integrated value. The process in STEP 3 is performed in the counter part 407 of the MC 401B. In STEP 3, if the count of the third integrated value is being already progressed, the count is continued.

On the other hand, if it is determined that the relevant conditioning performance conditions are not satisfied (No in STEP 2), in STEP 6, the MC 401B maintains the idle state of the process module 10B. In this case, a counter (not shown) of the counter part 407 regarding the third integrated value is reset to 0 (zero). Even if the item (1) of the relevant conditioning performance conditions is not satisfied, it is considered that the process module 10B is in a state where, for example, the number of the substrates W processed after the previous conditioning is small and conditioning is not required. Accordingly, in this step, as the relevant conditioning is not performed, waste of cleaning gas and power consumption can be reduced.

Next, in STEP 4, it is determined whether or not the third integrated value corresponding to the elapsed time exceeds a predetermined set value N3. Here, although the set value N3 may be arbitrarily set in consideration of the first conditioning time Pc1 and the second conditioning time Pc2 as described above, the set value N3 is preferably set to be equal to a subtraction of the second conditioning time Pc2 from the first conditioning time Pc1 (Pc1−Pc2). By setting the set value N3 in this manner, the conditionings of the process modules 10A and 10B can be substantially simultaneously ended. In addition, by setting the set value N3 to be shorter than the subtraction of the second conditioning time Pc2 from the first conditioning time Pc1, the conditioning of the process module 10B can be completed earlier than the conditioning of the process module 10A. Conversely, by setting the set value N3 to be longer than the subtraction of the second conditioning time Pc2 from the first conditioning time Pc1 by the amount of time required for process of one substrate W in the process module 10A, end of the conditioning of the process module 10B can be synchronized with end of process of a first substrate W after the conditioning in the process module 10A.

If it is determined that the third integrated value exceeds the set value N3 (Yes in STEP 4), in STEP 5, the controller 70 executes the conditioning in the process module 10B (conditioning execution control). This process of STEP 5 is well-known in the art and detailed explanation thereof will be here omitted but the substrate processing apparatus 1 may be performed in the following sequence. First, the MC 401B of the controller 70 sends a performance request of conditioning of the process module 10B to the EC 301. Upon receiving this request, the EC 301 reads recipes including conditioning conditions from the hard disk drive 307 and sends the read recipes, along with a command to permit the conditioning performance, to the MC 401B. The MC 401B executes the conditioning of the process module 10B based on the read recipes. This point becomes a timing when the conditioning of the process module 10B is performed. On the other hand, if it is determined that the third integrated value does not exceed the set value N3 (No in STEP 4), STEP 2 to STEP 4 are repeated until the third integrated value exceeds the set value N3.

In the conditioning method of this embodiment, the final determination on whether or not to perform the conditioning may be made at either the point of determination of STEP 2 or the point of determination of STEP 4. If satisfying the conditioning performance conditions (Yes in STEP 2) is adopted as the final determination on whether or not to perform the conditioning, the determination in STEP 4 on whether or not the third integrated value exceeds the set value N3 may be positioned to be formal. On the other hand, if the determination that the third integrated value exceeds the set value N3 (Yes in STEP 4) is adopted as the final determination on whether or not to perform the conditioning, the determination in STEP 2 on whether or not to satisfy the conditioning performance conditions may be positioned to be preliminary.

Such conditioning will be described in more detail below by way of an example where the set value N2 serving as a basis of the determination on whether or not to perform the relevant conditioning of the process module 10B is 500 which corresponds to a subtraction of the set value N1 of the process module 10A from the set value N4 of the process module 10B.

When the conditioning of the process module 10A is first performed under a state where the function of the relevant conditioning is valid, since the number of consecutively processed substrates in the process module 10B is 500 which is equal to the set value N2, the controller 70 determines the relevant conditioning of the process module 10B to be performed. Upon the subsequent conditioning of the process module 10A, since the number of consecutively processed substrates in the process module 10B is again 500 which is equal to the set value N2, the controller 70 determines the relevant conditioning of the process module 10B to be performed. In this example, the conditioning of the process module 10B is performed at the same cycle as the conditioning of the process module 10A.

In the above-described example, the number of consecutively processed substrates in the process module 10B is basically equal to the number of consecutively processed substrates in the process module 10A. However, in some case, the number of consecutively processed substrates in the process module 10B may not be equal to the number of consecutively processed substrates in the process module 10A from some cause. As one example, the cause may involve employment of the conditioning method of this embodiment in the course of repeated performance of the series of processes in the process modules 10A and 10B. That is, this is a case where, prior to application of the relevant conditioning, a normal conditioning is performed based on the first integrated value and the set value N1 in the process module 10A, and, independently of that, a normal conditioning is performed based on the second integrated value and the set value N4 in the process module 10B. As another example, the cause may involve a case where any abnormality occurs during performance of the first film forming process in the process module 10A and the substrate W processed in the process module 10A is not transferred to the process module 10B. In this case, the number of consecutively processed substrates in the process module 10B becomes smaller than the number of consecutively processed substrates in the process module 10A. As a result, the number of consecutively processed substrates in the process module 10B becomes smaller than 500 when the conditioning of the process module 10A is performed. For example, if the number of consecutively processed substrates in the process module 10B is 475 which is smaller than the set value N2 when the conditioning of the process module 10A is performed, the controller 70 does not execute the relevant conditioning in the process module 10B. However, until the next conditioning of the process module 10A is performed, the number of consecutively processed substrates in the process module 10B becomes larger than the set value N2 (for example becomes 975) as the number of (for example 500) substrates W processed between the consecutive two conditionings of the process module 10A is integrated. Accordingly, when the next conditioning of the process module 10A is performed, the controller 70 executes the relevant conditioning in the process module 10B.

The reason why the set value N2 is preferably set to be equal to the value obtained by subtracting the set value N1 of the process module 10A from the set value N4 of the process module 10B will be described below.

If the controller 70 determines the conditioning of the process module 10B (hereinafter referred to as a "first conditioning") not to be performed, there is a need to prevent the number of consecutively processed substrates in the process module 10B from exceeding the set value N4 of the process module 10B until the next conditioning of the process module 10A (hereinafter referred to as a "second conditioning") is performed. If the number of consecutively processed substrates in the process module 10B exceeds the set value N4 of the process module 10B before the conditioning of the process module 10A is performed, the normal conditioning of the process module 10B is performed independently of the conditioning of the process module 10A. Since a substrate processed in the process module 10A cannot be processed in the process module 10B during the conditioning of the process module 10B, the process module 10A also enters an idle state, which leads to a low throughput.

As a matter of course, the number of consecutively processed substrates in the process module 10B at the point when the controller 70 determines the conditioning of the process module 10B not to be performed is smaller than the set value N2. Here, if the number of consecutively processed substrates at this point is represented by '$n_{B1}$,' a relationship between the number of consecutively processed substrates $n_{B1}$ and the set value N2 is expressed by the following equation (1).

$$n_{B1} < N2 \qquad (1)$$

In addition, until the second conditioning is performed from this point, the number of substrates W processed in the process module 10B is equal to or less than the set value N1 of the process module 10A. Here, the number of consecutively processed substrates in the process module 10B at the point when the second conditioning is performed is represented by '$n_{B2}$.' The following equation (2) is obtained from a relationship between the set value N1 and the numbers of consecutively processed substrates $n_{B1}$ and $n_{B2}$.

$$n_{B2} \leq n_{B1} + N1$$

$$n_{B1} \geq n_{B2} - N1 \qquad (2)$$

The following equation (3) is obtained from the above equations (1) and (2).

$$n_{B2} - N1 \leq n_{B1} < N2 \qquad (3)$$

It is here assumed that the set value N2 is equal to a subtraction of the set value N1 of the process module 10A from the set value N4 of the process module 10B. A relationship between the set value N2 and the set values N1 and N4 is expressed by the following equation (4).

$$N2 = N4 - N1 \qquad (4)$$

The following equation (5) is obtained by substituting the equation (4) for the equation (3).

$$n_{B2} - N1 \leq n_{B1} < N4 - N1$$

$$n_{B2} \leq n_{B1} + N1 < N4 \qquad (5)$$

As can be understood from the equation (5), when the set value N2 becomes equal to a subtraction of the set value N1 of the process module 10A from the set value N4 of the process module 10B, the number of consecutively processed substrates $n_{B2}$ can be smaller than the maximum number of processed substrates N4. If the number of consecutively processed substrates $n_{B2}$ is equal to or greater than the set value N2, the controller 70 determines the conditioning of the process module 10B to be performed. On the other hand, if the number of consecutively processed substrates $n_{w2}$ is less than the set value N2, the controller 70 determines the conditioning of the process module 10B not to be performed. In this case, for the same reason as in the above description made by referring to the equations (1) to (5), the number of consecutively processed substrates in the process module 10B at a point when a third conditioning of the process module 10A is performed becomes smaller than the set value N4.

In this manner, by setting the set value N2 to be equal to a subtraction of the set value N1 of the process module 10A from the set value N4 of the process module 10B, it is possible to prevent the number of consecutively processed substrates in the process module 10B from exceeding the set value N4 of the process module 10B. Accordingly, the conditioning of the process module 10A is necessarily performed when the conditioning in the process module 10B is performed, which can increase a throughput in the substrate processing apparatus 1.

The above description made by referring to the equations (1) to (5) may be applied to a case where any number smaller than the set value N1 is used instead of the set value N1. Accordingly, the above description is also applied to a case where the number of consecutively processed substrates in the process module 10A is smaller than the set value N1 of the process module 10A.

Next, effects of the substrate processing apparatus 1 and the conditioning method according to this embodiment will be described. The substrate processing apparatus 1 of this embodiment includes the process modules 10A, 10B, 10C and 10D in which respective predetermined processes are performed on the substrate W, and the controller 70 which controls operation of the process modules 10A, 10B, 100 and 10D. The process modules 10A and 10B are combined to perform a series of processes for the substrate W. The process modules 100 and 10D are combined to perform a series of processes for the substrate W. However, since the substrate W cannot be transferred from the process module 10A to the process module 10B during the conditioning in the process module 10B, the first film forming process cannot be performed on a next substrate W. Accordingly, if the conditionings of a pair of the process module 10A and the process module 10B performing a series of processes are performed independently of each other, a throughput of the process module 10A is lowered by the sum of an amount of time required in the conditioning of the process module 10B and an amount of time required in the conditioning of the process module 10A.

Accordingly, as described above, in the relevant conditioning of this embodiment, when the conditioning of the process module 10A performing a series of processes together with the process module 10B starts and the series of processes is stopped, the determination is made whether or not to perform the conditioning of the process module 10B. In this embodiment, this makes it possible to harmonize the period of the conditioning in the process module 10B with the period of the conditioning in the process module 10A. That is, in the relevant conditioning, since it is possible to overlap the periods of the conditionings of the process module 10A and the process module 10B, the conditioning of the process module 10B can be performed while the conditioning in the process module 10A is being performed. As a result, in the process module 10A, the substrate W can be processed in succession according to a series of processes until the first integrated value reaches the set value N1, without being stopped by the conditioning of the process module 10B. Accordingly, throughputs of the process modules 10A and 10B can be increased. In this manner, according to this embodiment, the throughput of the substrate processing apparatus 1 can be increased with the increase of the throughputs of the process modules 10A and 10B.

In addition, in this embodiment, the determination on whether or not to perform the conditioning of the process module 10B is made based on the second integrated value which is integrated in accordance with the process of the substrate W in the process module 10B and becomes zero by performance of the conditioning of the process module 10B. More specifically, the conditioning of the process module 10B is performed when the second integrated value is equal to or greater than the predetermined set value N2. Accordingly, if the number of processes of the process module 10B is small and the interior of the process chamber 30 is in a cleaning state which requires no conditioning, the relevant conditioning is not performed. This makes it possible to reduce the consumption of relatively expensive cleaning gas.

In addition, in this embodiment, the second integrated value is an integrated value of the number of substrates W processed in the process module 10B and the determination on whether or not to perform the conditioning of the process module 10B is made based on the second integrated value and the set value N2. It is here preferable that the set value N2 is equal to a subtraction of the set value N1, which corresponds to the number of substrates W that can be continuously processed without performing the conditioning in the process module 10A, from the set value N4, which corresponds to the number of substrates W that can be continuously processed without performing the conditioning in the process module 10B. According to this embodiment, for the reason described by referring to the equations (1) to (5), this makes it possible to prevent the number of substrates W processed without performing the conditioning in the process module 10B (the number of consecutively processed substrates) from exceeding the set value N4 of the process module 10B (that is, to prevent independent performance of normal conditioning in the process module 10B).

In addition, in this embodiment, the first conditioning time Pc1, which corresponds to time required for the conditioning of the process module 10A, is longer than the second conditioning time Pc2, which corresponds to time required for the conditioning of the process module 10B. According to this embodiment, this makes it possible to complete the conditioning of the process module 10B until the conditioning of the process module 10A is completed, by performing the conditioning of the process module 10B while the conditioning in the process module 10A is being performed. As a result, according to this embodiment, it is possible to make idle time caused by performing only the conditioning of the process module 10B substantially zero.

In addition, in this embodiment, the conditioning of the process module 10B is performed at least after the point when the third integrated value exceeds the set value N3 from the point when the conditioning of the process module 10A starts. By setting the set value N3 to be equal to, or shorter or longer than a value obtained by subtracting the second conditioning time Pc2 from the first conditioning time Pc1, it is possible to end the conditioning of the process module 10B substantially at the same time of end of the conditioning of the process module 10A or at desired points before and after that time. In this manner, according to this embodiment, it is possible to prevent a throughput from being reduced due to the conditioning of the process module 10B. In addition, preferably, the timing when the conditioning of the process module 10A is completed can be synchronized with the timing when the relevant conditioning of the process module 10B is completed. This makes it possible to allow the process modules 10A and 10B to perform the subsequent first and second film forming processes with no delays and prevent deterioration of a throughput.

The above description about the process modules 10A and 10B may be applied to the process modules 100 and 10D.

In addition, in this embodiment, the process modules 100 and 10D have the same series of processes as the process modules 10A and 10B. Therefore, according to this embodiment, the process modules 100 and 10D can perform the series of processes for the substrate W while the conditionings of the process modules 10A and 10B are being performed. According to this embodiment, this can increase a throughput of the substrate processing apparatus 1.

Figure 8A:
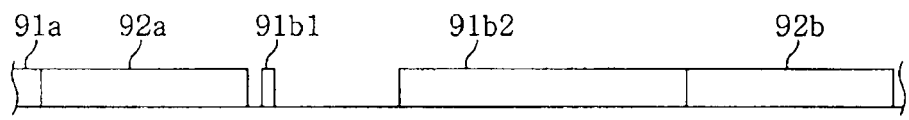
FIGS. 8A and 8B are schematic explanatory views showing a flow of process of process modules according to a comparative example.
Figure 8B:
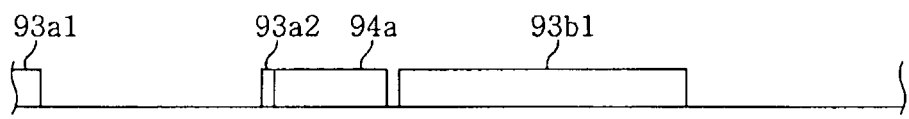

Next, effects of the conditioning method of this embodiment will be described in more detail in comparison with a conditioning method of a comparative example. FIGS. 8A and 8B is a schematic explanatory view showing a flow of process of the process modules 10A and 10B according to a comparative example. FIG. 8A shows a flow of process of the process module 10A. FIG. 8B shows a flow of process of the process module 10B. In FIGS. 8A and 8B, reference numerals 91$a$, 91$b$1 and 91$b$2 denote a period of time during which the first film forming process is performed in the process module 10A, reference numerals 92$a$ and 92$b$ denote a period of time during which conditioning of the process module 10A is performed, reference numerals 93$a$1, 93$a$2 and 93$b$1 denote a period of time during which the second film forming process is performed in the process module 10B, and reference numeral 94$a$ denotes a period of time during which conditioning of the process module 10B is performed. In FIGS. 8A and 8B, a period of time during which the first and second film forming processes and the conditioning are not performed is a period of time during which the process module 10A or the process module 10B is in an idle state (standby state).

In the comparative example, the conditioning of the process module 10A is performed when the number of consecutively processed substrates in the process module 10A reaches the set value N1 (for example 500) of the process module 10A. In addition, the conditioning of the process module 10B is performed only when the number of consecutively processed substrates in the process module 10B reaches the set value N4 (for example 1000) of the process module 10B (normal conditioning).

At a point when the number of consecutively processed substrates in the process module 10A reaches the set value N1, if the number of consecutively processed substrates in the process module 10B is equal to or less than the set value N4 (for example is 975), the conditioning 92$a$ starts in the process module 10A and the second film forming process 93$a$1 is stopped in the process module 10B, as shown in FIGS. 8A and 8B. While the process module 10A is being conditioned, the process module 10B is in the idle state. After the conditioning of the process module 10A is completed, the first film forming process 91$b$1 of a next cycle starts in the process module 10A and the second film forming process 93$a$2 resumes in the process module 10B.

Next, at a point when the number of consecutively processed substrates in the process module 10B reaches the set value N4, even when the number of consecutively processed substrates in the process module 10A is equal to or less than the set value N1 (for example is 25), the first film forming process 91$b$1 is stopped in the process module 10A and the conditioning 94$a$ starts in the process module 10B. While the process module 10B is being conditioned, the process module 10A is in the idle state. After the conditioning of the process module 10B is completed, the first film forming process 91$b$2 resumes in the process module 10A and the second film forming process 93$b$1 of a next cycle starts in the process module 10B. Next, at a point when the number of consecutively processed substrates in the process module 10A reaches the set value N1, if the number of consecutively processed substrates in the process module 10B is equal to or less than the set value N4 (for example is 475), the conditioning 92$b$ starts in the process module 10A and the second film forming process 93$b$1 is stopped in the process module 10B.

Thus, in the conditioning method of the comparative example, the period of the conditioning of the process module 10B cannot be harmonized with the period of the conditioning of the process module 10A. Accordingly, in the conditioning method of the comparative example, the process module 10B is in the idle state while the process module 10A is being conditioned, and the process module 10A is in the idle state while the process module 10B is being conditioned. As a result, a throughput is reduced.

In contrast, in this embodiment, the conditioning of the process module 10B is performed while the process module 10A is being conditioned, as described above with reference to FIGS. 6A and 6B. As a result, according to this embodiment, throughputs of the process modules 10A and 10B can be increased over the conditioning method of the comparative example.

The present invention is not limited to the disclosed embodiment but may be modified in different ways. For example, although it has been illustrated in the embodiment that the substrate processing apparatus 1 has four process modules 10, the number of process modules 10 may be two or more. In addition, the series of processes for the substrate W may be performed in a combination of three or more process modules 10. In addition, the series of processes in the process modules 10C and 10D may be different from the series of processes in the process modules 10A and 10B.

In addition, although it has been illustrated in the embodiment that the series of processes for the substrate W is performed in the process module 10A and the process module 10B in order, the series of processes for the substrate W may be performed in the process module 10B and the process module 10A in order. In addition, the series of processes for the substrate W may include processes other than the film forming process.

In addition, the present invention is not limited to the substrate processing apparatus 1 configured as shown in FIG. 1 but may be applied to other various substrate processing apparatuses. In addition, a substrate W to be processed in the substrate processing apparatus 1 is not limited to a substrate for manufacture of semiconductor devices but may be, for example, a glass substrate for manufacture of a flat panel display, a substrate for manufacture of a solar cell panel, and so on.

While the invention has been shown and described with respect to the embodiments, it will be understood by those skilled in the art that various changes and modification may be made without departing from the scope of the invention as defined in the following claims.

What is claimed is:
1. A conditioning method for conditioning interiors of a plurality of process chambers of a substrate processing apparatus in which predetermined processes are performed on a substrate, the process chambers including a first and a second process chamber combined to perform a series of processes for the substrate, the method comprising:

performing conditioning of the interior of the first process chamber if a first integrated value set in connection with the process of the substrate reaches a set value N1;

setting the second process chamber in a standby state when the conditioning of the first process chamber starts and the series of processes is stopped;

determining at least whether or not a second integrated value set in connection with process of the substrate in the second process chamber is equal to or greater than a set value N2;

starting count of a third integrated value in the second process chamber if the second integrated value is equal to or greater than the set value N2; and performing a conditioning of the second process chamber if the third integrated value exceeds a set value N3, wherein the second process chamber is set to perform the conditioning, independently of the first process chamber, when the second integrated value reaches a set value N4 which is larger than the set value N1, and the set value N2 is equal to a value obtained by subtracting the set value N1 from the set value N4, wherein the first integrated value becomes zero by the performance of the conditioning of the first process chamber and is calculated from an end of an immediately preceding conditioning of the first process chamber, and the second integrated value becomes zero by the performance of the conditioning of the second process chamber and is calculated from an end of an immediately preceding conditioning of the second process chamber.

2. The conditioning method of claim 1, wherein the series of processes includes a process of performing a predetermined process for the substrate in the first process chamber and a process of performing a process, which is different from the process performed in the first process chamber, in the second process chamber for the substrate subjected to the predetermined process.

3. The conditioning method of claim 2, wherein the first integrated value is the number of substrates processed in the first process chamber, and the second integrated value is the number of substrates processed in the second process chamber.

4. The conditioning method of claim 1, wherein the third integrated value is elapsed time in a standby state of the second process chamber.

5. The conditioning method of claim 1, wherein time required for the conditioning of the first process chamber is longer than time required for the conditioning of the second process chamber.

6. The conditioning method of claim 5, wherein the set value N3 is equal to or shorter than a value obtained by subtracting the time required for the conditioning of the second process chamber from the time required for the conditioning of the first process chamber.

7. The conditioning method of claim 5, wherein the set value N3 is longer than a value obtained by subtracting the time required for the conditioning of the second process chamber from the time required for the conditioning of the first process chamber by an amount of time required for the predetermined process for one substrate which is performed in the first process chamber.

8. The conditioning method of claim 1, wherein, before the start of count of the third integrated value, the second integrated value is compared with the set value N2 in order to determine whether or not to perform the conditioning of the second process chamber.

9. The conditioning method of claim 1, wherein it is determined whether or not to perform the conditioning of the second process chamber based on a determination on whether or not the third integrated values exceeds the set value N3.

10. The conditioning method of claim 1, wherein the conditionings include at least one of cleaning to remove attachments in the process chambers and pre-coating to deposit thin films in the process chambers.

11. The conditioning method of claim 1, wherein the substrate is processed in the first process chamber and then processed in the second process chamber.

12. The conditioning method of claim 1, wherein the set value N2 is larger than the set value N1.

* * * * *